(12) United States Patent
Kimura et al.

(10) Patent No.: US 6,657,531 B2
(45) Date of Patent: Dec. 2, 2003

(54) FUSE CIRCUIT USING CAPACITORS AS FUSE ELEMENTS

(75) Inventors: Tohru Kimura, Yokohama (JP); Masaru Koyanagi, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 31 days.

(21) Appl. No.: 10/026,230

(22) Filed: Dec. 21, 2001

(65) Prior Publication Data

US 2002/0080004 A1 Jun. 27, 2002

(30) Foreign Application Priority Data

Dec. 27, 2000 (JP) ........................................ 2000-399222

(51) Int. Cl.[7] ........................ H01H 85/30; H01H 85/04; G11C 11/4193
(52) U.S. Cl. ........................ 337/167; 337/283; 337/158; 365/225.7
(58) Field of Search ................................. 337/158, 167, 337/170, 283, 401, 412; 29/623; 257/209, 529, 530; 438/467, 600, 601; 365/225.7

(56) References Cited

U.S. PATENT DOCUMENTS

| | | | | |
|---|---|---|---|---|
| 4,730,129 A | * | 3/1988 | Kunitoki et al. | ............ 327/525 |
| 5,418,487 A | * | 5/1995 | Armstrong, II | ............. 327/525 |
| 5,442,589 A | * | 8/1995 | Kowalski | ................. 365/225.7 |
| 5,731,733 A | * | 3/1998 | Denham | ..................... 327/525 |
| 6,104,649 A | * | 8/2000 | Toda | .......................... 365/200 |
| 6,172,929 B1 | * | 1/2001 | Carson et al. | ........... 365/225.7 |
| 6,346,846 B1 | * | 2/2002 | Bertin et al. | ................ 327/525 |
| 6,400,632 B1 | * | 6/2002 | Tanizaki et al. | ......... 365/225.7 |
| 6,426,911 B1 | * | 7/2002 | Lehmann et al. | ........ 365/225.7 |
| 6,430,101 B1 | * | 8/2002 | Toda | ....................... 365/225.7 |
| 6,438,059 B2 | * | 8/2002 | Akita et al. | .............. 365/225.7 |
| 6,498,526 B2 | * | 12/2002 | Lim et al. | .................... 327/525 |
| 2002/0093867 A1 | * | 7/2002 | Muraoka et al. | ......... 365/225.7 |

FOREIGN PATENT DOCUMENTS

JP      2001-067893      3/2001

* cited by examiner

Primary Examiner—Anatoly Vortman
(74) Attorney, Agent, or Firm—Hogan & Hartson, LLP

(57) ABSTRACT

A fuse circuit includes electrical fuse elements which are commonly connected at one-side ends, a voltage generating section and a readout section. The voltage generating section is configured to selectively apply program voltage for destroying the electrical fuse element and read voltage for reading out the destructive/nondestructive states of the electrical fuse elements to a common connection node of the one-side ends of the electrical fuse elements. The readout section is configured to read out the destructive/nondestructive states of the electrical fuse elements from the other ends of the electrical fuse elements when the read voltage is applied to the common connection node from the voltage generating section.

50 Claims, 7 Drawing Sheets

FUSE CIRCUIT USING CAPACITORS AS FUSE ELEMENTS

CROSS-REFERENCE TO RELATED APPLICATIONS

This application is based upon and claims the benefit of priority from the prior Japanese Patent Application No. 2000-399222, filed Dec. 27, 2000, the entire contents of which are incorporated herein by reference.

BACKGROUND OF THE INVENTION

1. Field of the Invention

This invention relates to a fuse circuit using capacitors as fuse elements and more particularly to a fuse circuit to attain a stable operation when a destructive/nondestructive state of the fuse element is read out.

2. Description of the Related Art

A fuse element is widely used as one means for changing the circuit configuration of a completed semiconductor device. The conventional fuse element is formed of a metal or polysilicon material and it is a general method of blowing out the fuse element by use of a laser device. However, in order to blow out the fuse element by applying laser light, it is necessary to set up a state in which the fuse element is exposed and it is impossible to blow out the fuse element after it is sealed in a package, for example.

An electrical fuse element is developed to solve the above problem. The electrical fuse element uses a capacitor or high-resistance polysilicon layer as the fuse element and high voltage is applied to or a large current is supplied to the fuse element directly from an input pin or from a control circuit inside the chip to destroy the fuse element.

In a narrow sense, a fuse element such as a high-resistance polysilicon layer which is normally set in a conductive state and made nonconductive at the time of destruction is called an electrical fuse and a fuse element such as a capacitor which is normally set in a nonconductive state and made conductive at the time of destruction is called an anti fuse in some cases. However, in a wide sense, both of the above fuse elements are called an electrical fuse in this specification.

However, the fuse circuit in the conventional system described in the above document is difficult to obtain a sufficiently large read current which permits the operation of reading out a destructive/nondestructive state to be stably performed. This is because a read current which is caused to flow to determine the destructive/nondestructive state is as small as several tenths $\mu A$ to several $\mu A$ and varies to a large extent when the capacitor used as the fuse element is destroyed.

BRIEF SUMMARY OF THE INVENTION

A fuse circuit according to one aspect of the present invention comprises electrical fuse elements which are commonly connected at one-side ends; a voltage generating section which is configured to selectively apply program voltage for destroying the electrical fuse element and read voltage for reading out destructive/nondestructive states of the electrical fuse elements to a common connection node of the one-side ends of the electrical fuse elements; and a readout section which is configured to read out the destructive/nondestructive states of the electrical fuse elements from the other ends of the electrical fuse elements when the read voltage is applied to the common connection node from the voltage generating section.

DETAILED DESCRIPTION OF THE INVENTION

[First Embodiment]

Figure 1:
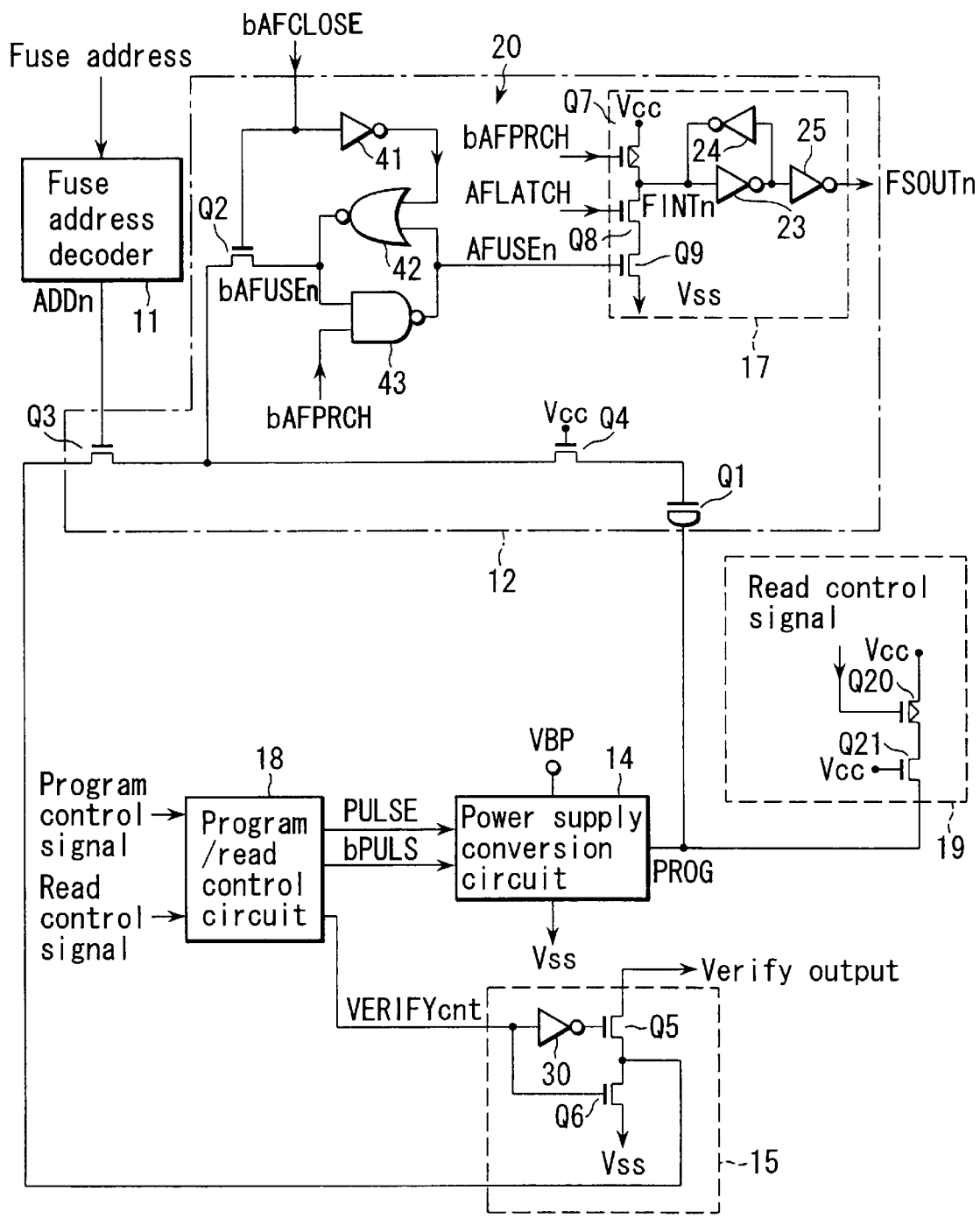
FIG. 1 is a circuit diagram showing an example of the circuit configuration of an electrical fuse system using capacitors as electrical fuse elements, for illustrating a fuse circuit according to a first embodiment of this invention.

FIG. 1 is a circuit diagram showing an example of the circuit configuration of an electrical fuse system using capacitors as fuse elements, for illustrating a fuse circuit according to a first embodiment of this invention. The electrical fuse system includes a fuse address decoder 11, fuse set 12, program/read control circuit 18, power supply conversion circuit 14, verify output circuit 15, read power supply circuit 19 and the like.

The fuse address decoder 11 is supplied with a fuse address and a fuse selection signal ADDn output from the fuse address decoder 11 is supplied to the fuse set 12. The fuse set 12 is configured to include a capacitor Q1 as an electrical fuse element, NMOS (N-channel MOS) transistors Q2, Q3, Q4, fuse determination circuit 20, fuse latch circuit 17 and the like. The fuse sets 12 corresponding in number (n) to fuse elements required are provided, but in FIG. 1, one fuse set is shown as a representative for brevity of the drawing. If n fuse sets are provided, one-side electrodes of capacitors Q1 are commonly connected and the common connection node is connected to the program/ read control circuit 18, power supply conversion circuit 14, verify output circuit 15 and read power supply circuit 19.

One end of the current path of the NMOS transistor Q3 is connected to the verify output circuit 15, the other end of the current path thereof is connected to one-side ends of the NMOS transistors Q2, Q4 and the gate thereof is supplied with the fuse selection signal ADDn output from the fuse address decoder 11. The gate of the NMOS transistor Q2 is supplied with a fuse determination circuit cut-off signal bAFCLOSE. Further, the gate of the NMOS transistor Q4 is connected to a power supply Vcc and the other end of the current path thereof is connected to one electrode of the capacitor Q1.

The fuse determination circuit 20 is configured by an inverter 41, NOR gate 42 and NAND gate 43. The inverter 41 is supplied with the fuse determination circuit cut-off signal bAFCLOSE and an output signal from the inverter is supplied to one input terminal of the NOR gate 42. The other input terminal of the NOR gate 42 is supplied with a signal AFUSEn output from the NAND gate 43. One input terminal of the NAND gate 43 is supplied with a signal bAF-PRCH which is an inverted signal of a precharge signal AFPRCH and the other input terminal thereof is supplied with a signal bAFUSEn output from the NOR gate 42. A signal AFUSEn output from the NAND gate 43 is supplied to the fuse latch circuit 17.

The fuse latch circuit 17 is configured by a PMOS (P-channel MOS) transistor Q7 and NMOS transistors Q8, Q9 whose current paths are serially connected between the power supply Vcc and the ground node Vss and inverters 23, 24, 25. The gate of the PMOS transistor Q7 is supplied with the signal bAFPRCH which is an inverted signal of the precharge signal AFPRCH. The gate of the NMOS transistor Q8 is supplied with a fuse latch signal AFLATCH. The gate of the NMOS transistor Q9 is supplied with an output signal AFUSEn of the fuse determination circuit 16. A connection node of the current paths of the PMOS transistor Q7 and the NMOS transistor Q8 is connected to the input terminal of the inverter 23 and the output terminal of the inverter 24. The output terminal of the inverter 23 and the input terminal of the inverter 24 are connected to the input terminal of the inverter 25. A signal FSOUTn is output from the output terminal of the inverter 25.

Further, the program/read control circuit 18 is supplied with a program control signal and read control signal and supplies signals PULSE and bPULSE as a power supply conversion circuit control signal to the power supply conversion circuit 14. A signal VERIFYcnt output from the program/read control circuit 18 is supplied to the verify output circuit 15.

The power supply conversion circuit 14 is operated on voltage between a power supply VBP and the ground node Vss to supply a stress signal PROG to the other electrode of the capacitor Q1 used as the electrical fuse element.

The verify output circuit 15 is configured by an inverter 30 and NMOS transistors Q5, Q6. One-side ends of the current paths of the NMOS transistors Q5 and Q6 are connected together and the other end of the NMOS transistor Q6 is connected to the ground node Vss. The signal VERIFYcnt output from the program/read control circuit 18 is supplied to the gate of the NMOS transistor Q6 and is inverted by the inverter 30 and supplied to the gate of the NMOS transistor Q5. A verify output is obtained from the other current path of the NMOS transistor Q5.

Further, the read power supply circuit 19 is configured by a PMOS transistor Q20 and NMOS transistor Q21. One end of the current path of the PMOS transistor Q20 is connected to the power supply Vcc and the gate thereof is supplied with a read control signal. One end of the current path of the NMOS transistor Q21 is connected to the other end of the current path of the PMOS transistor Q20, the other end of the current path thereof is connected to the other electrode of the capacitor Q1 and the gate thereof is connected to the power supply Vcc.

Figure 2:
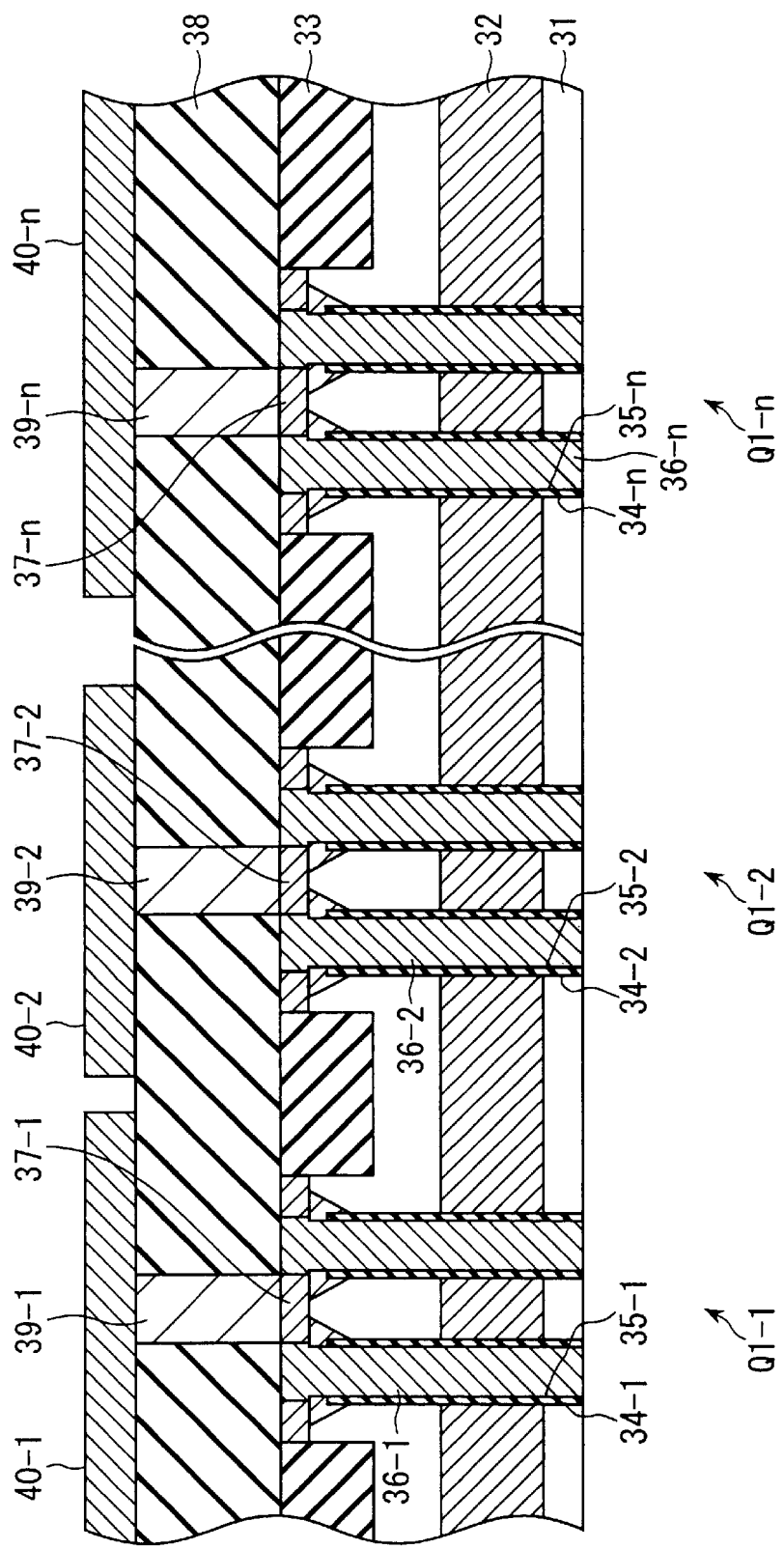
FIG. 2 is a cross sectional view for illustrating an example of the structure of the electrical fuse element (capacitor) in the circuit shown in FIG. 1.

FIG. 2 is a cross sectional view of a trench capacitor having the same structure as a trench type memory cell, for illustrating an example of the structure of the capacitor in the circuit shown in FIG. 1.

As shown in FIG. 2, a buried plate 32 formed of a buried well region is formed in a deep position of a semiconductor substrate (silicon substrate) 31 and an element isolation region 33 of STI structure is formed in the surface region thereof. In an element region of the silicon substrate 31, deep trenches 34-1, 34-2, . . . , 34-n are formed to extend from the surface region to a depth so as to penetrate through the buried plate 32. On the inner walls of the deep trenches 34-1, 34-2, . . . , 34-n, capacitor insulator films 35-1, 35-2, . . . , 35-n are respectively formed and buried electrodes 36-1, 36-2, . . . , 36-n are buried (filled) in the respective trenches. In the surface region of the substrate 31 near the openings of the deep trenches 34-1, 34-2, . . . , 34-n, n-type diffused layers 37-1, 37-2, . . . , 37-n are formed, respectively. Further, on the substrate 31, an inter-level insulating film 38 is formed and metal interconnections 40 are formed on the inter-level insulating film 38. In portions of the inter-level insulating film 38 which lie on the n-type diffused layers 37-1, 37-2, . . . , 37-n, contact plugs 39-1, 39-2, . . . , 39-n are respectively formed and the buried electrodes 36-1, 36-2, . . . , 36-n are electrically connected to the metal interconnections 40-1, 40-2, . . . , 40-n via the n-type diffused layers 37-1, 37-2, . . . , 37-n and contact plugs 39-1, 39-2, . . . , 39-n, respectively.

The buried plate 32 corresponds to one electrode of each of capacitors Q1-1, Q1-2, . . . , Q1-n used as fuse elements, each of the capacitor insulating films 35 corresponds to a capacitor insulating film, and the buried electrodes 36-1, 36-2, . . . , 36-n respectively correspond to the other electrodes of the capacitors. That is, the buried plate 32 is commonly used by a plurality of capacitors Q1-1, Q1-2, . . . , Q1-n. Further, the metal interconnections 40-1, 40-2, . . . , 40-n respectively correspond to interconnections connected to the other electrodes of the capacitors Q1-1, Q1-2, . . . , Q1-n.

Next, the operation of the device with the above configuration is explained.

In the program operation (destruction of the fuse element), an electrical fuse element which is desired to be subjected to the program operation is selected by inputting an address of the fuse element Q1 (Q1-1, Q1-2, . . . , Q1-n) which is desired to be programmed to the fuse address decoder 11 and setting the fuse selection signal ADDn to the "H" level so as to turn ON the transistor Q3. At the same time, the fuse determination circuit cut-off signal bAFCLOSE is set to the "L" level to turn OFF the transistor Q2 so as to electrically isolate the fuse determination circuit 20 from the fuse element Q1.

Then, the program control signal is supplied to the program/read control circuit 18 so that the circuit 18 will turn ON the transistor Q6, thereby attaining a current path from VBP to Vss and setting a stress signal PROG to a VBP potential by use of the power supply conversion circuit control signals PULSE, bPULSE to apply stress to the fuse element Q1. At this time, the read power supply circuit 19 is prevented from being operated by setting the read control signal to the "H" level to turn OFF the transistor Q20.

Like the program operation, in the verify (destruction determining) operation, an address of the fuse element Q1 which is desired to be verified is input to the fuse address decoder 11 to select the fuse element. Then, the program control signal is input, but in this case, the verify operation is different from the program operation in that the power supply conversion circuit control signals PULSE, bPULSE are input to the power supply conversion circuit 14 so as to set the stress signal PROG into an electrically floating state by use of the read control signal, and at the same time, the read power supply circuit 19 is operated to charge the stress signal PROG to the "H" level (in this case, (Vcc-VthN)). In this case, the circuit configuration is made to turn ON the transistor Q5 by use of the read control signal and a current path is attained between the power supply Vcc of the read power supply circuit 19 and the verify output node. At this time, since a DC current path is formed between the power supply Vcc and the verify output node via the transistor Q5 if the fuse element Q1 has been destroyed, it becomes possible to monitor a current by use of an external pad, for example.

In the read operation (readout of the destructive/nondestructive state of the fuse element), a pulse of "L" level is supplied as the precharge signal bAFPRCH supplied to the fuse determination circuit 20 at the start timing of the read operation, the signal AFUSEn is charged to the "H" level and the signal bAFUSEn is set to the "L" level and latched. At this time, the fuse selection signal ADDn is set at the "L" level and the fuse determination circuit cut-off signal bAFCLOSE is set at the "H" level. At this time, since the signal bAFPRCH is set at the "L" level and the fuse latch signal AFLATCH is also set at the "L" level, a signal FINT is also charged to the "H" level and latched. If the signals AFUSEn and FINT are latched at the "H" level, the signal bAFPRCH is set to the "H" level. Like the verify operation, in the read operation, since the configuration is made to charge the stress signal PROG to the "H" level (in this case, (Vcc-VthN)) by use of the read control signal, the signal bAFUSEn is coupled to the signal PROG and set to the "H" level (in this case, (Vcc-VthN)) when the fuse element Q1 is set in the destructive state. Therefore, the state of the fuse determination circuit 20 is inverted to set the signal AFUSEn to the "L" level. Further, the signals bAFUSEn and AFUSEn are respectively kept at the "L" level and "H" level when the fuse element Q1 is set in the nondestructive state. If a pulse of "H" level is applied as the signal AFLATCH after the state of the signal AFUSEn is determined, an output signal FSOUTn is set to the "H" level while the signal FINTn is kept at the "H" level when the fuse element Q1 has been destroyed. On the other hand, if the fuse element Q1 is not destroyed, the signal FINTn is inverted to the "L" level and the output signal FSOUTn is set to the "L" level.

With the above circuit configuration, since the direction of the current flowing through the fuse element Q1 at the time of read operation and verify operation can be set to the same direction of the current at the time of program operation, a sufficiently large read current which permits the stable read operation can be attained and the operation of the electrical fuse system can be stabilized. Further, since voltage is applied to a portion of the fuse element Q1 having higher withstand voltage, that is, to the buried plate (buried well) 32 at the time of destruction of the fuse element and readout operation, the reliability of the electrical fuse element can be enhanced and the circuit and pattern area can be reduced in size.

This is because a plurality of capacitor elements are generally formed while well regions formed on the semiconductor substrate are set at the common potential in a case where the capacitor elements are formed on the semiconductor substrate. In order to prevent diffusion (junction leak) into the semiconductor substrate, n-type or p-type impurity of low impurity concentration is doped into the well region. On the other hand, n-type or p-type impurity of high impurity concentration is doped to reduce the resistance component on the other electrode side with an insulating film disposed therebetween. Thus, when the impurity concentration is different in the semiconductor layer, the withstand voltage becomes higher when applying voltage to the well region in which the impurity concentration is lower than when applying voltage to the other electrode side with the insulating film disposed therebetween.

Further, at the time of program, the fuse element is destroyed by applying high voltage to one electrode and connecting the other electrode to the ground node Vss. In this case, in order to apply the high voltage to the other electrode side opposite to the well region with the insulating film disposed therebetween, it is necessary to selectively set the high voltage node or separate the well regions of the respective fuse elements and selectively set the ground node Vss. In either case, a heavy penalty will be imposed on the circuit and pattern area. On the other hand, if the high voltage is applied to the common well region of the plurality of fuse elements, the circuit and pattern area can be reduced in size.

[Second Embodiment]

Figure 3:
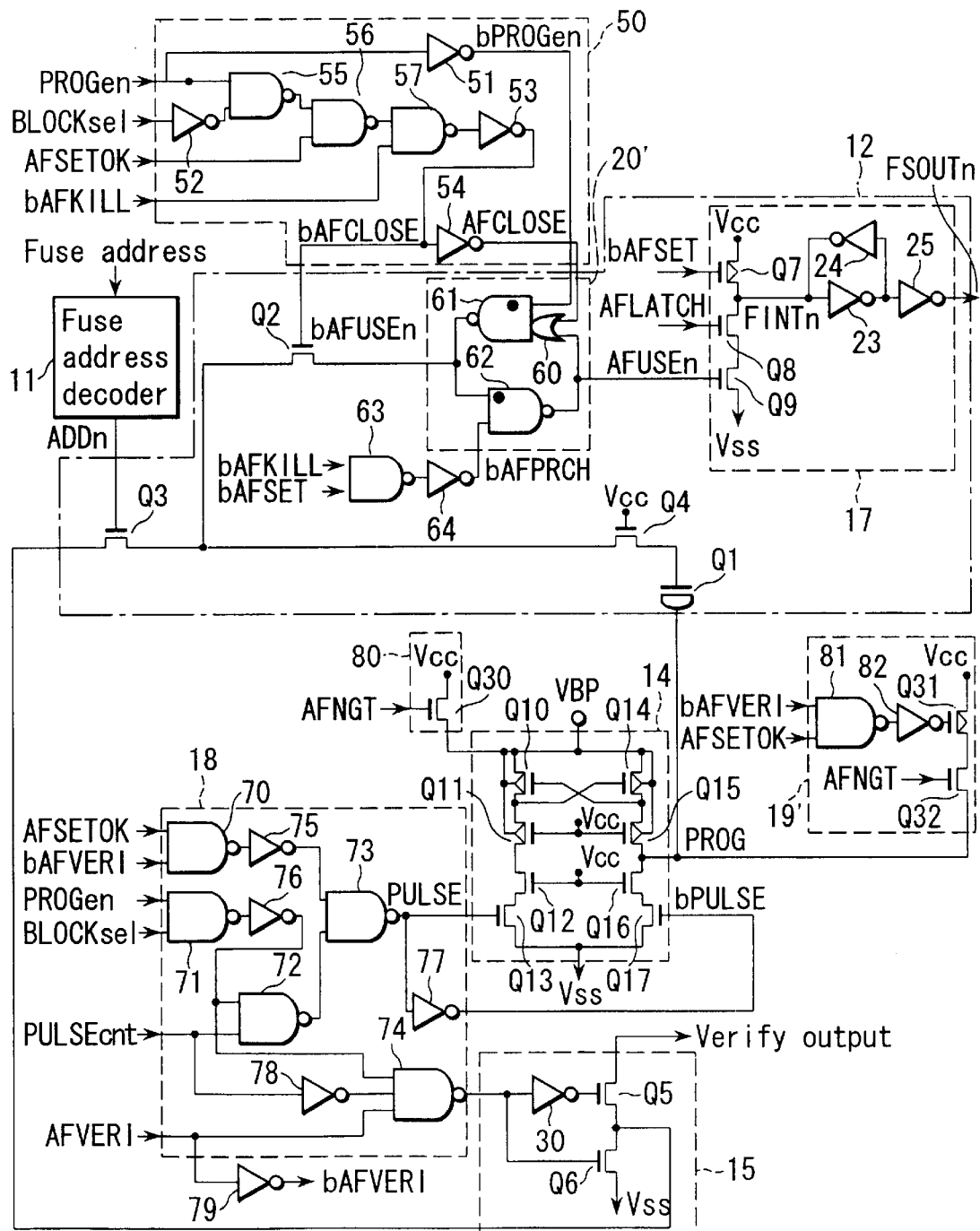
FIG. 3 is a circuit diagram showing an example of the circuit configuration of an electrical fuse system using capacitor as electrical fuse elements, for illustrating a fuse circuit according to a second embodiment of this invention.
Figure 4A:
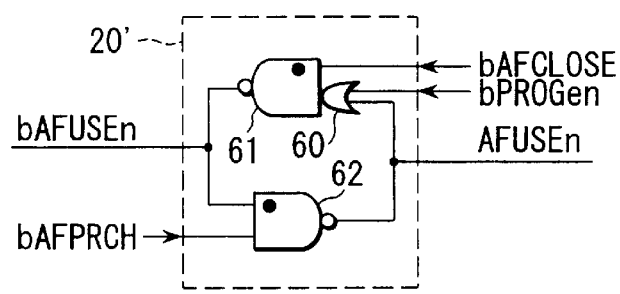
FIG. 4A is a logic circuit diagram for illustrating a concrete example of the configuration of a fuse determination circuit in the circuit shown in FIG. 3.
Figure 4B:
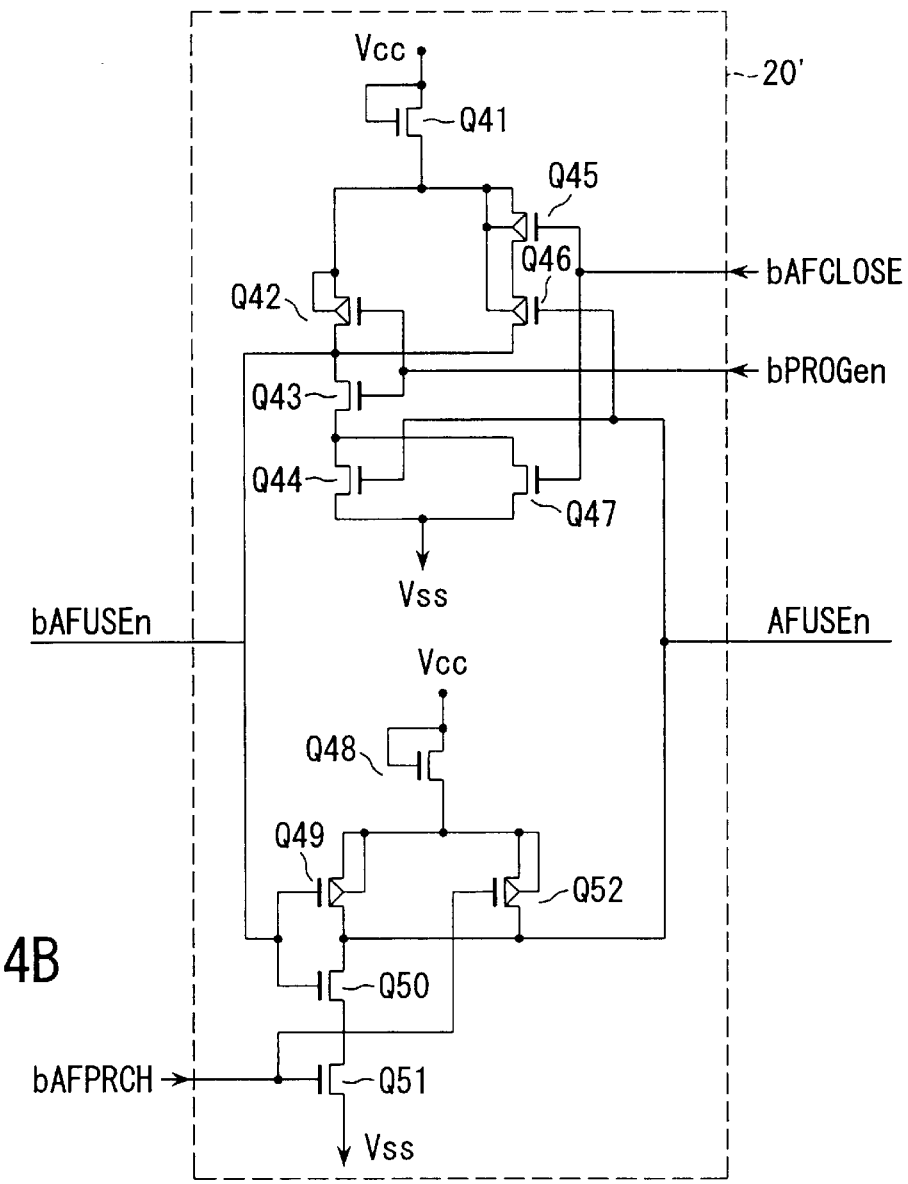
FIG. 4B is a circuit diagram showing a concrete example of the circuit configuration of FIG. 4A, for illustrating a concrete example of the configuration of the fuse determination circuit in the circuit shown in FIG. 3.
Figure 5:
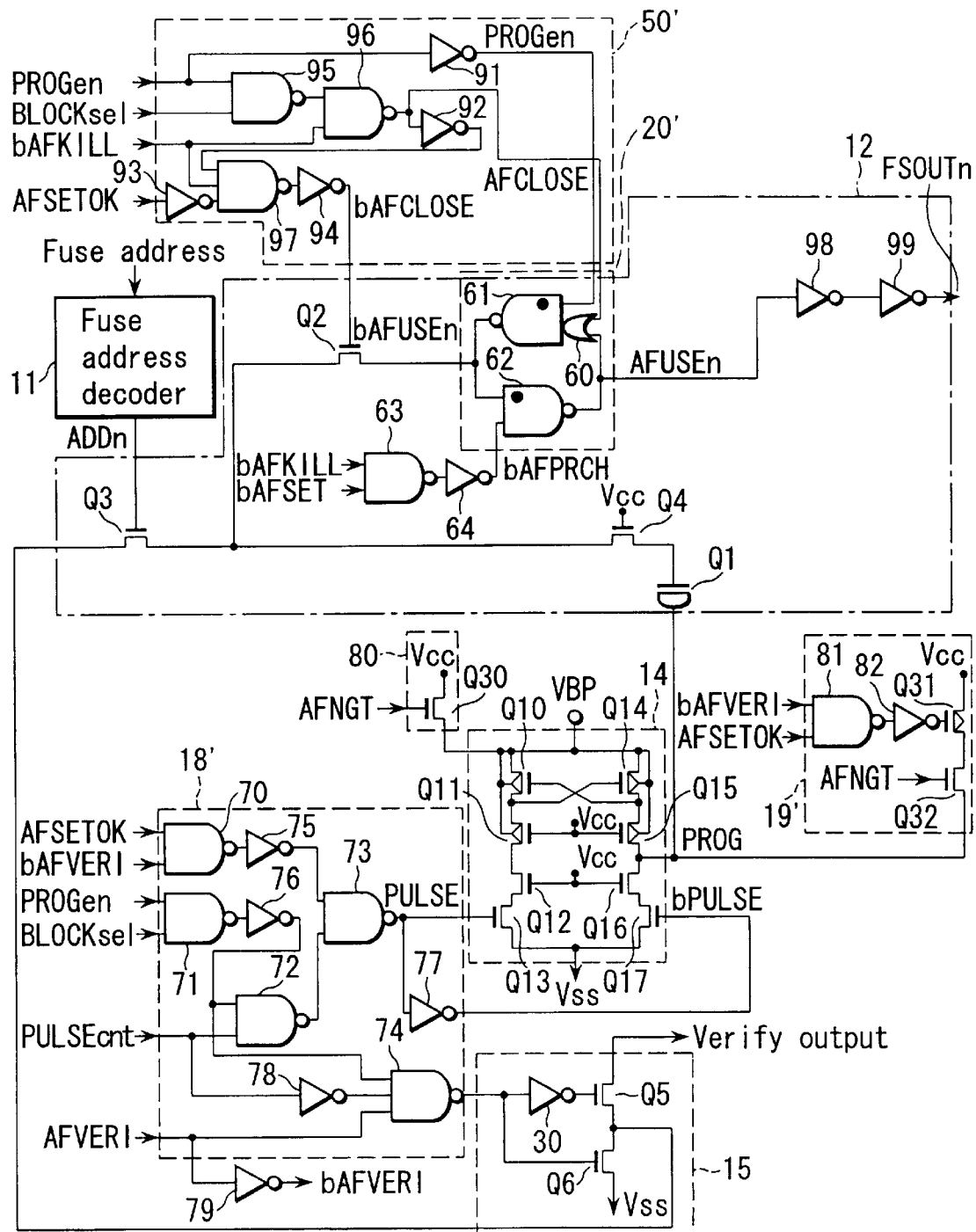
FIG. 5 is a circuit diagram showing an example of the circuit configuration of an electrical fuse system using capacitors as electrical fuse elements, for illustrating a modification of the fuse circuit according to the second embodiment of this invention.
Figure 7:
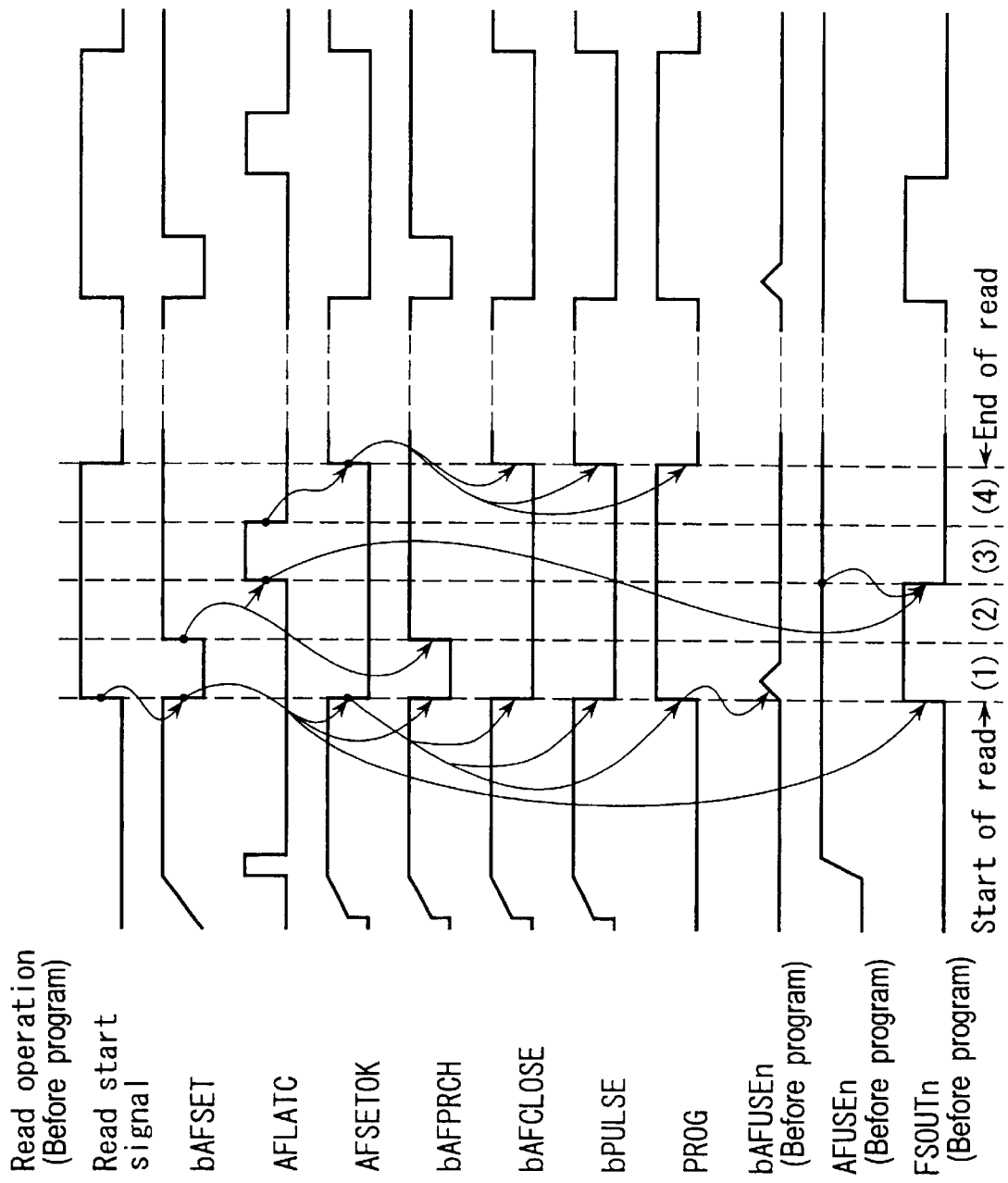
FIG. 7 is a timing chart at the time of read operation (before program) in the circuit shown in FIGS. 3 to 5.

FIGS. 3 to 5 show an example of the circuit configuration of an electrical fuse system using a capacitor as an electrical fuse element, for illustrating a fuse circuit according to a second embodiment of this invention. FIGS. 7 and 8 are timing charts in the read operation of the circuit shown in FIGS. 3 to 5.

In FIGS. 3 to 5, constituent portions which are the similar to those of FIG. 1 are denoted by the same reference numerals and the detail explanation therefor is omitted.

The circuit shown in FIG. 3 is different from the circuit shown in FIG. 1 in that a control circuit 50 of the fuse determination circuit and a read VBP circuit 80 are additionally provided, the logical configuration of a fuse determination circuit 20' is changed because the control circuit 50 of the fuse determination circuit is additionally provided, the configuration of a read power supply circuit 19' is changed and the concrete logical configuration of a program control circuit 18' is changed.

That is, the control circuit 50 of the fuse determination circuit is configured to include inverters 51 to 54 and NAND gates 55 to 57. A program enable signal PROGen is supplied to the input terminal of the inverter 51 and one input terminal of the NAND gate 55. An inverted signal bPROGen of the program enable signal PROGen output from the inverter 51 is supplied to the fuse determination circuit 20'. A program control circuit selection signal BLOCKsel is supplied to the other input terminal of the NAND gate 55 via the inverter 52. An output signal of the NAND gate 55 is supplied to one input terminal of the NAND gate 56. A read control signal AFSETOK is supplied to the other input terminal of the NAND gate 56 whose output signal is supplied to one input terminal of the NAND gate 57. A fuse circuit interruption signal bAFKILL which is used to temporarily or permanently interrupt the operation of the fuse circuit is supplied to the other input terminal of the NAND gate 57 whose output signal is supplied to the input terminal of the inverter 53. The inverter 53 supplies a fuse determination circuit cut-off signal bAFCLOSE to the gate of the transistor Q2 and supplies the signal to the inverter 54. An output signal AFCLOSE of the inverter 54 is supplied to the fuse determination circuit 20'.

Further, the fuse determination circuit 20' is configured to include an OR gate 60 and NAND gates 61, 62. The signal AFCLOSE output from the inverter 54 is supplied to one input terminal of the OR gate 60 and a signal AFUSEn output from the NAND gate 62 is supplied to the other input terminal thereof. An output signal of the OR gate 60 is supplied to one input terminal of the NAND gate 61 and a signal bPROGen output from the inverter 51 is supplied to the other input terminal of the NAND gate 61. An output signal bAFUSE output from the NAND gate 61 is supplied to one end of the current path of the transistor Q2 and one input terminal of the NAND gate 62. A signal bAFPRCH which is an inverted signal of the precharge signal AFPRCH is supplied to the other input terminal of the NAND gate 62. The signal bAFPRCH is generated by use of the NAND gate 63 which is supplied with the signal bAFKILL and signal bAFSET and the inverter 64 which inverts an output signal of the NAND gate 63.

The program control circuit 18' is configured to include NAND gates 70 to 74 and inverters 75 to 78. A read control signal AFSETOK and an inverted signal bAFVERI of a verify control signal AFVERI are supplied to the NAND gate 70 which in turn supplies an output signal to one input terminal of the NAND gate 73 via the inverter 75. A program enable signal PROGen and program control circuit selection signal BLOCKsel are supplied to the NAND gate 71 which in turn supplies an output signal to one input terminal of the NAND gate 72 and the first input terminal of the NAND gate 74 via the inverter 76. A program pulse control signal PULSEcnt is supplied to the other input terminal of the NAND gate 72 and supplied to the second input terminal of the NAND gate 74 via the inverter 78. The verify control signal AFVERI is supplied to the third input terminal of the NAND gate 74 and supplied to the inverter 79 which in turn supplies an inverted signal bAFVERI.

A signal PULSE output from the NAND gate 73 and a signal bPULSE obtained by inverting the above signal by use of the inverter 77 are supplied to the power supply conversion circuit 14 as a power supply conversion circuit control signal. Further, an output signal of the NAND gate 74 is supplied to the verify output circuit 15.

The read VBP circuit 80 is configured by an NMOS transistor Q30 having a current path which is connected at one end to the power supply Vcc and connected at the other end to a VBP node of the power supply conversion circuit 14 and a gate supplied with a power supply generation circuit control signal AFNGT.

The program control circuit 18' is configured to include a PMOS transistor Q31, NMOS transistor Q32, NAND gate 81 and inverter 82. The NAND gate 81 is supplied with the inverted signal bAFVERI of the verify control signal AFVERI and a read control signal AFSETOK and supplies an output signal to the gate of the PMOS transistor Q31 via the inverter 82. One end of the current path of the PMOS transistor Q31 is connected to the power supply Vcc and the other end of the current path thereof is connected to one end of the current path of the NMOS transistor Q32. The other end of the current path of the NMOS transistor Q32 is connected to the other electrode of the capacitor Q1 used as a fuse element and the gate thereof is supplied with the power supply generation circuit control signal AFNGT.

FIGS. 4A and 4B specifically illustrate the fuse determination circuit 20' shown in FIG. 3, FIG. 4A is a logical circuit diagram and FIG. 4B is a circuit diagram showing the detail circuit configuration thereof. As shown in FIG. 4B, the circuit is configured to include NMOS transistors Q41, Q43 to Q48, Q50, Q51 and PMOS transistors Q42, Q45, Q46, Q49, Q52. One end of the current path of the PMOS transistor Q41 and the gate thereof are connected to the power supply Vcc. The current paths of the PMOS transistor Q42 and NMOS transistors Q43, Q44 are serially connected between the other end of the current path of the PMOS transistor Q41 and the ground node Vss. Further, the other end of the current path of the PMOS transistor Q41 is connected to one end of the current path of the PMOS transistor Q45. The other end of the current path of the PMOS transistor Q45 is connected to one end of the current path of the PMOS transistor Q46 and the other end of the current path of the PMOS transistor Q46 is connected to a connection node of the current paths of the PMOS transistor Q42 and the NMOS transistor Q43. A connection node of the current paths of the NMOS transistors Q43 and Q44 is connected to one end of the current path of the NMOS transistor Q47 which is connected to the ground node Vss at the other end of the current path. The gates of the PMOS transistor Q42 and the NMOS transistor Q43 are supplied with an inverted signal bPROGen of the program enable signal PROGen and the gates of the PMOS transistor Q45 and the NMOS transistor Q47 are supplied with a fuse determination circuit cut-off signal bAFCLOSE. A signal bAFUSEn is output from a connection node of the current paths of the PMOS transistors Q42, Q46 and the NMOS transistor Q43.

One end of the current path of the PMOS transistor Q48 and the gate thereof are connected to the power supply Vcc. The current paths of the PMOS transistor Q49 and NMOS transistors Q50, Q51 are serially connected between the other end of the current path of the PMOS transistor Q48 and the ground node Vss. Further, the other end of the current path of the PMOS transistor Q48 is connected to one end of the current path of the PMOS transistor Q52. The other end of the current path of the PMOS transistor Q52 is connected to a connection node of the current paths of the PMOS transistor Q49 and the NMOS transistor Q50. The gates of the PMOS transistor Q49 and the NMOS transistor Q50 are supplied with the signal bAFUSEn and the gates of the PMOS transistor Q52 and the NMOS transistor Q51 are supplied with a signal bAFPRCH which is an inverted signal of the precharge signal AFPRCH. A signal AFUSEn is output from a connection node of the current paths of the PMOS transistors Q49, Q52 and the NMOS transistor Q50 and supplied to the gates of the NMOS transistor Q44 and PMOS transistor Q46.

The reason why the NMOS transistors Q41, Q48 are provided in the concrete example of the circuit of the fuse determination circuit 20' of FIG. 4B and the potential (Vcc-VthN) which is lowered by the threshold voltage of the NMOS transistor is used as the power supply voltage is as follows. That is, the signal bAFUSEn is charged to the "H" level when the fuse element Q1 is set in the destructive state in the read operation, but at this time, the "H" level is set to a potential of (Vcc-VthN) because of the NMOS transistor Q4 whose gate is applied with the power supply voltage Vcc. Therefore, if the power supply voltage of the fuse determination circuit 20' is set to Vcc, both of the PMOS transistor and NMOS transistor of the 2-input NAND logic circuit are turned ON so that the signal AFUSEn may be set to the "L" level (Vss) with delay and erroneous data will be latched in the initial state in which the signal bAFPRCH is changed from the "L" level (Vss) to the "H" level (Vcc) to invert the state of the fuse determination circuit 20' by use of the "H" level (Vcc-VthN) of the signal bAFUSEn.

FIG. 5 shows a modification of the circuit shown in FIGS. 4A and 4B. The circuit includes inverters 98, 99 instead of the fuse latch circuit 17 and part of a control circuit 50' of the fuse determination circuit is changed according to a change in the circuit. The other basic configuration is the same as the circuit shown in FIGS. 4A and 4B and is operated in substantially the same manner.

That is, the control circuit 50' of the fuse determination circuit is configured by inverters 91 to 94 and NAND gates 95 to 97. A program enable signal PROGen is supplied to the input terminal of the inverter 91 and one input terminal of the NAND gate 95. An inverted signal bPROGen of the program enable signal PROGen output from the inverter 91 is supplied to the fuse determination circuit 20'. Further, a program control circuit selection signal BLOCKsel is supplied to the other input terminal of the NAND gate 95. An output signal of the NAND gate 95 is supplied to one input terminal of the NAND gate 96. The other input terminal of the NAND gate 96 is supplied with a fuse circuit interruption signal bAFKILL which is used to temporarily or permanently interrupt the operation of the fuse circuit. The fuse circuit interruption signal bAFKILL is supplied to the first input terminal of the NAND gate 97 and a read control signal AFSETOK is supplied to the second input terminal thereof. An output signal AFCLOSE of the NAN gate 96 is supplied to the fuse determination circuit 20' and supplied to the third input terminal of the NAND gate 97 via the inverter 92. An output signal of the NAND gate 97 is supplied to the gate of the NMOS transistor Q2 as a fuse determination circuit cut-off signal bAFCLOSE via the inverter 94.

Next, the operation of the electrical fuse system with the above configuration is explained.

First, in the program operation (destruction of the fuse element), the program enable signal PROGen is set to the "H" level so as to make the electrical fuse system operable. At this time, since the inverted signal bPROGen of the program enable signal PROGen is set to the "L" level, the signal bAFUSEn is charged to the "H" level. At the same time, since the fuse determination circuit cut-off signal bAFCLOSE is changed from the "L" level to the "H" level, the transistor Q2 is turned ON to electrically connect the fuse determination circuit 20' and fuse element Q1 to each other. As a result, the voltage across each of the transistors Q4 in all of the fuse sets 12 is charged to (Vcc-VthN). In this case, the reason why the voltage across each of the transistors Q4 in all of the fuse sets 12 is charged to (Vcc-VthN) is that stress (potential difference) applied to the non-selected fuse element Q3 in the program operation is alleviated to enhance the reliability and the characteristic because the stress signal PROG is commonly supplied to all of the fuse sets 12.

Then, a desired fuse set which is desired to be subjected to the program operation is selected from a plurality of fuse sets 12 by inputting an address of the fuse element Q1 (Q1-1, Q1-2, ... , Q1-n) which is desired to be programmed to the fuse address decoder 11 and setting the fuse selection signal ADDn to the "H" level to turn ON the transistor Q3. At the same time, the signal BLOCKsel is set to the "H" level by use of a fuse set selection address which is used to select a plurality of fuse sets provided on the chip. If the signal BLOCKsel is set to the "H" level, the signal bAFCLOSE is set to the "L" level to turn OFF the transistor Q2 so as to electrically isolate the fuse determination circuit 20' of the selected fuse set from the fuse element Q1.

Next, stress is applied to the fuse element Q1 by setting the program pulse control signal PULSEcnt to the "H" level to turn ON the transistor Q6 so as to attain a current path from VBP to the ground node Vss and setting the power supply conversion circuit control signals PULSE and bPULSE to the "H" level and "L" level, respectively, to set the stress signal PROG to the VBP potential. At this time, since the verify control signal AFVERI and read control signal AFSETOK are both set at the "L" level and an inverted signal bAFVERI of the verify control signal AFVERI is set at the "H" level, the read power supply circuit 19' is not operated. Further, at this time, a power supply generation circuit control signal AFNGT is kept at the Vcc level. Thus, even if VBP is raised to Vcc or more, high voltage higher than Vcc is not applied to the PMOS transistor in the read power supply circuit 19', and therefore, a problem that the reliability and characteristic are degraded will not occur. Further, since the NMOS transistor is cut off in the read VBP circuit 80, VBP will not be connected to Vcc.

The verify (destruction determining) operation is performed as follows. Like the program operation, an address of the fuse element Q1 which is desired to be verified is input to the fuse address decoder 11 to select the fuse element. In this case, the verify operation is different from the program operation in that the VBP potential is set into an electrically floating state or set to the same potential as the stress signal PROG and the signal AFNGT is set to potential equal to or higher than (Vcc+VthN)). The potential is used as the read power supply voltage. Next, the signals PROGen and BLOCKsel which are set to the "H" level, the signal PULSEcnt which is set to the "L" level and the verify control signal AFVERI which is set to the "H" level are input to the program control circuit 18' to attain a current path between the signal PROG and the verify output. Further, if the signal AFVERI is set to the "H" level, the signals PULSE, bPULSE are respectively set to the "H" level and "L" level and an output of the power supply conversion circuit 14 is set into an electrically floating state, but the signal PROG is charged to the Vcc level by use of the read power supply circuit 19'. At this time, since a DC current path is formed between the power supply Vcc and the verify output node via the transistor Q5 if the fuse element Q1 is not destroyed, it becomes possible to monitor a current by use of an external pad, for example.

The read VBP circuit 80 is a circuit which generates the same potential as the signal PROG when VBP is set in the electrically floating condition and prevents flow of a forward current of a PN junction occurring in the PMOS transistor in the power supply conversion circuit 14 when the VBP potential becomes lower than the signal PROG. The reason why the signal AFNGT is set to potential equal to or higher than (Vcc+VthN) is that a larger read current is attained by increasing the potential difference applied across the fuse element Q1 after it has been destroyed.

Figure 6:
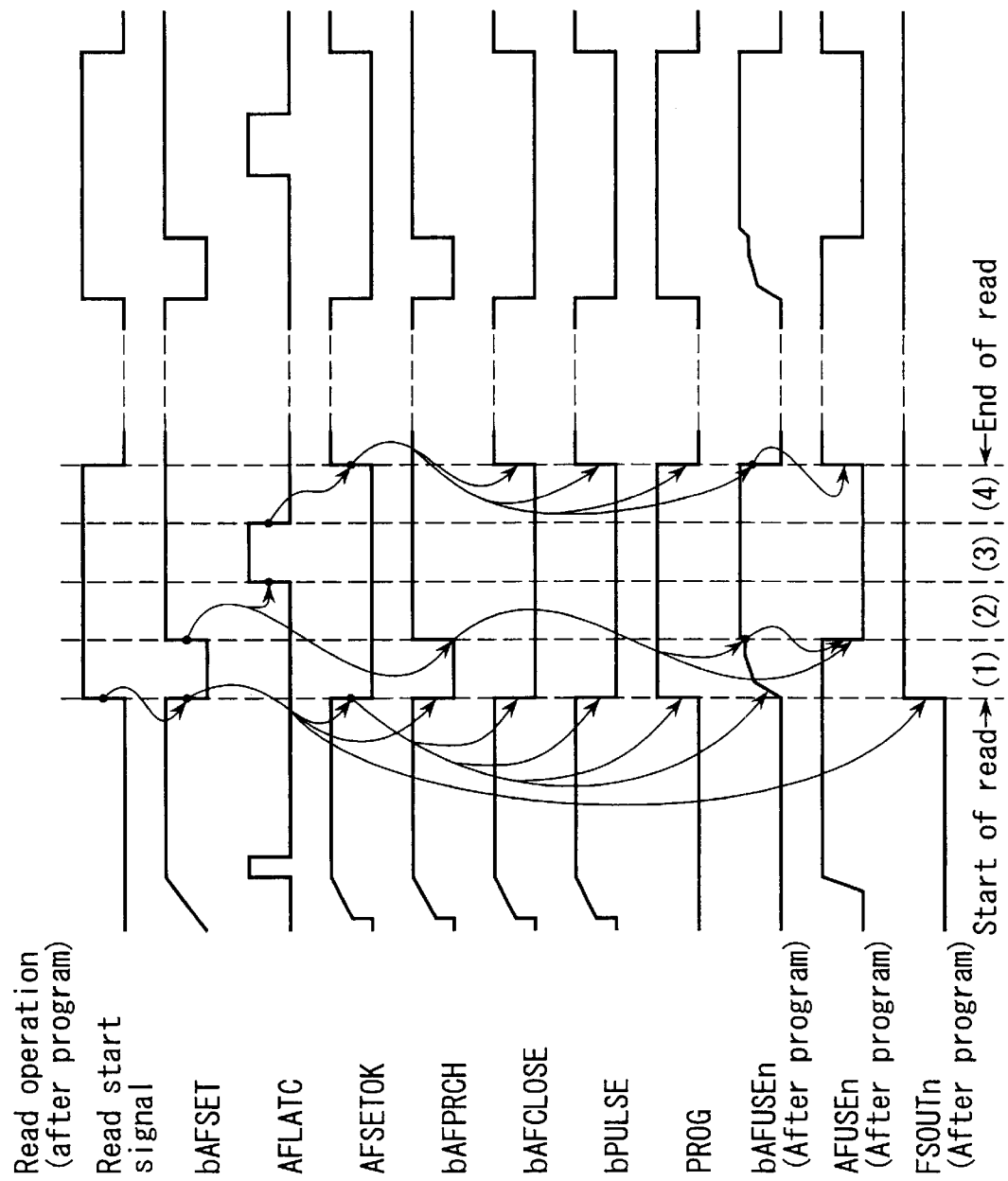
FIG. 6 is a timing chart at the time of read operation (after program) in the circuit shown in FIGS. 3 to 5.

The read operation (readout of the destructive/nondestructive state of the fuse element) is explained with reference to the timing charts of FIGS. 6 and 7. FIG. 6 is a timing chart after program and FIG. 7 is a timing chart before program. Like the case of the verify operation, the VBP potential is set into an electrically floating state or set to the same potential as the signal PROG and the signal AFNGT is set to potential which is not lower than (Vcc+VthN)). The potential is used as the read power supply voltage. At this time, the signals PROGen, BLOCKsel, PULSEcnt, AFVERI and ADDn input to the program control circuit 18' are set at the "L" level. At the read start time, a set signal bAFSET of the fuse determination circuit 20' is set to the "L" level in synchronism with the read control signal and a precharge signal bAFPRCH of the fuse determination circuit 20' is set to the "L" level. As a result, the signal AFUSEn is charged to the "H" level and the signal bAFUSEn is set to the "L" level and latched. At this time, since the signal bAFPRCH is set at the "L" level and the fuse latch signal AFLATCH is also set at the "L" level, the signal FINT is charged to the "H" level and latched. In addition, the signal POG is charged to the Vcc potential by use of the read power supply circuit 19' to apply potential to the fuse element Q1 by setting a read completion signal AFSETOK to the "L" level and the transistor Q2 which is a transfer gate between the fuse element Q1 and the fuse determination circuit 20' is turned ON by setting the signal bAFCLOSE to the "H" level, thereby permitting a current to flow in the same direction as in the case of the program operation.

In this case, the reason why the signal bAFCLOSE is set at the "H" level in the "L" level period of the signal bAFPRCH is as follows. That is, the read power supply circuit 19' charges the signal PROG to the Vcc potential if the signal AFSETOK is set at the "L" level, but since the signal PROG and the transistor Q4 are capacitively coupled to each other by use of the fuse element Q1 in the fuse set which is not programmed, the potentials of both ends of the transistor Q4 are set into an electrically floating state when the signal PROG is charged to the Vcc potential. Therefore, there occurs a possibility that the state of the fuse determination circuit 20' will be inverted when the signal bAFPRCH is set at the "H" level, and as a result, it becomes necessary to draw charges into the ground node Vss by use of the fuse determination circuit 20' (in the period (1) in FIGS. 6 and 7).

The setting operation of the signals AFUSEn, bAFUSEn is terminated by setting the signal bAFSET to the "H" level and setting the signal bAFPRCH to the "H" level after the "L" level latching state of the signal bAFUSEn and the "H" level latching state of the signal FINT are determined. Then, the level of the signal bAFUSEn is detected by use of the fuse determination circuit 20' to determine the level of the signal AFUSEn. At this time, if the fuse element Q1 is set in the destructive state, the signal bAFUSEn is coupled with the signal PROG and set to the "H" level (in this case, Vcc) to invert the state of the fuse determination circuit 20' and set the signal AFUSEn to the "L" level. If the fuse element Q1 is set in the nondestructive state, the signal bAFUSEn is kept at the "L" level and the signal AFUSEn is kept at the "H" level ((2) in FIGS. 6 and 7).

Next, the destructive/nondestructive state of the fuse element Q1 is determined by use of the fuse determination circuit 20', and after the levels of the signals AFUSEn, bAFUSEn are determined, the signal AFLATCH is set to the "H" level. If the signal AFUSEn is set at the "H" level (destructive state), the signal FINT is drawn to the "L" level and latched, if the signal AFUSEn is set at the "L" level (nondestructive state), the signal FINT is kept at the "H" level and latched, and the respective states are output from the fuse latch circuit 17 (in the period (3) in FIGS. 6 and 7).

After a series of operations described above is terminated, the signal AFSETOK is set to the "H" level to set the signal PROG to the Vss level and turn OFF the transistor Q2 so as to terminate the read operation (in the period (4) in FIGS. 6 and 7).

The read start signal may be generated in synchronism with the rise of the power supply voltage Vcc as in the conventional case, but it becomes possible to attain a lager read current of the fuse element Q1 after destruction by making a configuration which outputs the read start signal after the power supply voltage Vcc is raised to a rated potential and becomes sufficiently stable. For example, generally, the internal power supply generation circuits of the semiconductor device are driven to operate the internal power supply circuits immediately after the power supply Vcc is turned ON. Then, when the internal circuit detects that the internal power supply voltages becomes a preset potential, it outputs a signal which permits the normal operation to be started and the respective internal circuits can be set into operable states in response to the above signal. That is, since the power supply voltage Vcc is sufficiently raised to a rated potential and becomes stable in this state, the read start signal is output in synchronism with the operation enable signal of the respective internal circuits.

For example, in a device such as a RAM bus DRAM which generates a signal used for resetting the internal signal to an initial state each time a series of normal operations is started, the read operation can be performed by use of the power supply voltage in the more stable state by generating a read start signal in synchronism with the reset signal. Further, since the fuse circuit is set each time a series of normal operations is started, it becomes possible to re-set the fuse circuit even when the fuse circuit causes an erroneous operation by the influence of noise or the like in the normal operation and the reliability of the operation of the fuse circuit can be enhanced.

Further, in the embodiment shown in FIG. 3, the fuse set 12 which detects the destructive/nondestructive state of the fuse element Q1 is configured by the fuse determination circuit 20' and fuse latch circuit 17, but it becomes unnecessary to arrange the fuse latch circuit 17 by forming the control circuit 50' of the fuse determination circuit to have a configuration as shown in the modification of FIG. 6 and the circuit configuration can be simplified.

In FIG. 5, the inverters 98, 99 are provided, but it is permitted to provide only one of them.

In the first and second embodiments, the trench capacitor is used as the fuse element, but the same effect can be attained by using a capacitor of another structure such as a stack structure or MOS structure, for example. Further, it is possible to use an electrical fuse which is not a so-called anti fuse, and in this case, the polarity of the output FSOUTn is simply inverted and no problem occurs in the actual use.

As described above, according to one aspect of this invention, a fuse circuit can be obtained in which the stable operation can be attained in the read operation and verify operation and the reliability of the electrical fuse element can be enhanced.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A fuse circuit, comprising:

electrical fuse elements which are commonly connected at one-side ends;

a voltage generating section which is configured to selectively apply program voltage for destroying the electrical fuse element and read voltage for reading out destructive/nondestructive states of said electrical fuse elements to a common connection node of the one-side ends of said electrical fuse elements; and a readout section which is configured to read out the destructive/nondestructive states of said electrical fuse elements from the other ends of said electrical fuse elements when the read voltage is applied to the common connection node from said voltage generating section;

wherein said electrical fuse elements are capacitors, one electrode of each of the capacitors being formed of a well region in a semiconductor substrate and commonly used by the capacitors, the program voltage is applied to the well region from said voltage generating section when at least one of the capacitors is dielectrically broken down and programmed, and the read voltage is applied to the well region from said voltage generating section at least when the destructive/nondestructive state of the capacitor is read out.

2. A fuse circuit, comprising:

electrical fuse elements which are commonly connected at one-side ends;

a voltage generating section which is configured to selectively apply program voltage for destroying the electrical fuse element and read voltage for reading out destructive/nondestructive states of said electrical fuse elements to a common connection node of the one-side ends of said electrical fuse elements; and a readout section which is configured to read out the destructive/nondestructive states of said electrical fuse elements from the other ends of said electrical fuse elements when the read voltage is applied to the common connection node from said voltage generating section;

wherein said electrical fuse elements are trench capacitors each of which is configured to include a first electrode formed of a well region in a semiconductor substrate and commonly used by the trench capacitor, a capacitor insulating film formed on an inner wall of a trench formed in the semiconductor substrate to penetrate through the well region and a second electrode containing a conductive film buried in the trench, the program voltage is applied to the first electrode from said voltage generating section when at least one of the trench capacitors is dielectrically broken down and programmed, and the read voltage is applied to the first electrode from said voltage generating section at least when the destructive/nondestructive state of the trench capacitor is read out.

3. A fuse circuit, comprising:

electrical fuse elements which are commonly connected at one-side ends;

a voltage generating section which is configured to selectively apply program voltage for destroying the electrical fuse element and read voltage for reading out destructive/nondestructive states of said electrical fuse elements to a common connection node of the one-side ends of said electrical fuse elements; and a readout section which is configured to read out the destructive/nondestructive states of said electrical fuse elements from the other ends of said electrical fuse elements when the read voltage is applied to the common connection node from said voltage generating section;

wherein said voltage generating circuit includes a current supply circuit which causes a read current to flow through said electrical fuse element, said readout section includes a determination circuit which detects the magnitude of a read current flowing through the electrical fuse element and determines the destructive/nondestructive state of the electrical fuse element, and said current supply circuit and determination circuit are activated at least when the destructive/nondestructive state of the electrical fuse element is read out.

4. The fuse circuit according to claim 3, wherein said current supply circuit includes a constant voltage generator which generates constant voltage and causes a constant current to flow through said electrical fuse element by applying the constant voltage to said electrical fuse element.

5. The fuse circuit according to claim 3, wherein said current supply circuit supplies a current through a current path of an NMOS transistor, a gate potential of the NMOS transistor being set at substantially the same potential as the power supply voltage.

6. The fuse circuit according to claim 3, wherein said current supply circuit supplies a current through a current path of an NMOS transistor, sets a gate potential of the NMOS transistor to voltage higher than the sum of the power supply voltage and the threshold voltage of the NMOS transistor at least when the destructive/nondestructive state of the electrical fuse element is read out, and sets the gate potential of the NMOS transistor to one of the power supply voltage and ground potential at least at the time of destruction of said electrical fuse element.

7. The fuse circuit according to claim 3, wherein said determination circuit includes a state holding section which detects a read current flowing through said electrical fuse element to hold a state which is inverted from an initial state and an initial state setting section which determines an initial state of said state holding section synchronism with a read start signal and determines the destructive/nondestructive state of said electrical fuse element.

8. The fuse circuit according to claim 3, wherein said determination circuit includes a state holding section which detects a read current flowing through the electrical fuse element to hold a state which is inverted from an initial state and a first separation/connection section which electrically separates or connects said electrical fuse element, and said state holding section and said electrical fuse element are electrically connected to each other by means of said first separation/connection section at least when the destructive/nondestructive state of said electrical fuse element is read out.

9. The fuse circuit according to claim 3, wherein the power supply voltage of said determination circuit is set at substantially the same voltage as voltage applied to said determination circuit via said electrical fuse element when said electrical fuse element is set in the destructive state and is potential difference lower than at least the threshold voltage of an NMOS transistor.

10. The fuse circuit according to claim 7, wherein the read start signal is generated in synchronism with a signal which is output when the power supply voltage and internal power supply potentials are set to preset potentials and the normal operation can be started.

11. The fuse circuit according to claim 7, wherein the read start signal is generated in synchronism with a signal which sets an internal signal output before starting the normal operation to an initial state each time a series of normal operations is performed after turn-ON of the power supply voltage and the readout operation of the destructive/nondestructive state of said electrical fuse element by said readout section is performed before the normal operation is started for each series of normal operations.

12. A fuse circuit, comprising:

electrical fuse elements which are commonly connected at one-side ends;

a voltage generating section which is configured to selectively apply program voltage for destroying the electrical fuse element and read voltage for reading out destructive/nondestructive states of said electrical fuse elements to a common connection node of the one-side ends of said electrical fuse elements; and a readout section which is configured to read out the destructive/nondestructive states of said electrical fuse elements from the other ends of said electrical fuse elements when the read voltage is applied to the common connection node from said voltage generating section;

wherein said voltage generating section includes a stress applying circuit which applies stress of one of high voltage and large current to said electrical fuse element and a potential fixing circuit which sets said electrical fuse element at fixed potential and said stress applying circuit and potential fixing circuit are activated at least when said electrical fuse element is destroyed.

13. The fuse circuit according to claim 12, wherein said readout section includes a constant potential applying circuit which applies constant potential to a terminal of aid electrical fuse element which is opposite to said stress applying circuit and a second separation/connection section which electrically and selectively separates and connects said electrical fuse element and said constant potential applying circuit from and to each other, and the operation for destroying said electrical fuse element is performed after the terminal of said electrical fuse element which is opposite to said stress applying circuit is charged to constant potential before destruction of said electrical fuse element.

14. The fuse circuit according to claim 12, wherein said stress applying circuit includes a stress generator which generates one of high voltage and large current and a state setting circuit which selectively applies one of ground potential, high voltage and large current generated from said stress generator to said electrical fuse element or sets said electrical fuse element into an electrically floating state, at least one of the high voltage and large current generated from said stress generator is applied to said electrical fuse element by use of said state setting circuit at the time of destruction of said electrical fuse element, said electrical fuse element is set into the electrically floating state at the time of readout of the destructive/nondestructive state of said electrical fuse element, and said electrical fuse element is set at the ground potential when the normal operation is performed.

15. The fuse circuit according to claim 14, wherein said stress generator includes a potential generator which generates constant potential and generates one of potential which is set at substantially the same potential as that generated by said current supply circuit and potential having potential difference lower than the threshold voltage of a PN junction in a forward bias direction at least at the time of readout of the destructive/nondestructive state of said electrical fuse element.

16. A fuse circuit which selectively destroys electrical fuse elements and selectively reads out destructive/nondestructive states of the electrical fuse elements, comprising:

a fuse element destroying section which destroys the electrical fuse element;

a readout section which reads out the destructive/nondestructive state of the electrical fuse element; and a destruction determining section which determines the destructive state of the electrical fuse element;

wherein the direction of a current flowing in said fuse element destroying section to destroy the electrical fuse element, the direction of a current flowing in said readout section to read out the destructive/nondestructive state of the electrical fuse element and the direction of a current flowing in said destruction determining section to determine the destructive state of the electrical fuse element are set in the same direction, wherein voltage is applied to a portion of the electrical fuse element which has higher withstand voltage at the time of destruction of the electrical fuse element by use of said fuse element destroying section, at the time of readout of the destructive/nondestructive state of the electrical fuse element by use of said readout section and at the time of determination of the destructive state of the electrical fuse element by use of said destruction determining section.

17. A fuse circuit which selectively destroys electrical fuse elements and selectively reads out destructive/nondestructive states of the electrical fuse elements, comprising:

a fuse element destroying section which destroys the electrical fuse element;

a readout section which reads out the destructive/nondestructive state of the electrical fuse element; and a destruction determining section which determines the destructive state of the electrical fuse element;

wherein the direction of a current flowing in said fuse element destroying section to destroy the electrical fuse element, the direction of a current flowing in said readout section to read out the destructive/nondestructive state of the electrical fuse element and the direction of a current flowing in said destruction determining section to determine the destructive state of the electrical fuse element are set in the same direction, wherein the electrical fuse elements are capacitors, one electrode of each of the capacitors being formed of a well region in a semiconductor substrate, the well region is commonly used by plurality of capacitors, program voltage is applied to the well region from said fuse element destroying section when the capacitor is dielectrically broken down and programmed, and read voltage is applied to the well region from said readout section at least when the destructive/nondestructive state of the capacitor is read out.

18. A fuse circuit which selectively destroys electrical fuse elements and selectively reads out destructive/nondestructive states of the electrical fuse elements, comprising:

a fuse element destroying section which destroys the electrical fuse element;

a readout section which reads out the destructive/nondestructive state of the electrical fuse element; and a destruction determining section which determines the destructive state of the electrical fuse element;

wherein the direction of a current flowing in said fuse element destroying section to destroy the electrical fuse element, the direction of a current flowing in said readout section to read out the destructive/nondestructive state of the electrical fuse element and the direction of a current flowing in said destruction determining section to determine the destructive state of the electrical fuse element are set in the same direction, wherein the electrical fuse elements are trench capacitors each of which includes a first electrode formed of a well region in a semiconductor substrate, a capacitor insulating film formed on an inner wall of a trench formed in the semiconductor substrate to penetrate through the well region and a second electrode formed of a conductive film buried in the trench, the well region is commonly used by a plurality of trench capacitors, program voltage is applied to the first electrode from said fuse element destroying section when the trench capacitor is dielectrically broken down and programmed, and read voltage is applied to the first electrode from said readout section when the destructive/nondestructive state of the trench capacitor is read out.

19. A fuse circuit which selectively destroys electrical fuse elements and selectively reads out destructive/nondestructive states of the electrical fuse elements, comprising:

a fuse element destroying section which destroys the electrical fuse element;

a readout section which reads out the destructive/nondestructive state of the electrical fuse element; and a destruction determining section which determines the destructive state of the electrical fuse element;

wherein the direction of a current flowing in said fuse element destroying section to destroy the electrical fuse element, the direction of a current flowing in said readout section to read out the destructive/nondestructive state of the electrical fuse element and the direction of a current flowing in said destruction determining section to determine the destructive state of the electrical fuse element are set in the same direction, wherein said destruction determining section includes a first current supply circuit which causes a current to flow through the electrical fuse element and a potential fixing circuit which sets the electrical fuse element at fixed potential, and said first current supply circuit and potential fixing circuit are activated at least when the destructive/nondestructive state of the electrical fuse element is determined.

20. A fuse circuit which selectively destroys electrical fuse elements and selectively reads out destructive/nondestructive states of the electrical fuse elements, comprising:

a fuse element destroying section which destroys the electrical fuse element;

a readout section which reads out the destructive/nondestructive state of the electrical fuse element; and a destruction determining section which determines the destructive state of the electrical fuse element;

wherein the direction of a current flowing in said fuse element destroying section to destroy the electrical fuse element, the direction of a current flowing in said readout section to read out the destructive/nondestructive state of the electrical fuse element and the direction of a current flowing in said destruction determining section to determine the destructive state of the electrical fuse element are set in the same direction, wherein said readout section includes a second current supply circuit which causes a current to flow through the electrical fuse element and a determination circuit which detects the magnitude of a current flowing through the electrical fuse element and determines the destructive/nondestructive state of the electrical fuse element, and said second current supply circuit and determination circuit are activated at least when the destructive/nondestructive state of the electrical fuse element is read out.

21. The fuse circuit according to claim 20, wherein said determination circuit includes a state holding section which detects a current flowing when the electrical fuse element is set in the destructive state and holds a state which is inverted from an initial state and a first separation/connection section which electrically separates or connects the electrical fuse element, and said state holding section and the electrical fuse element are electrically connected to each other by means of said first separation/connection section at least when the destructive/nondestructive state of the electrical fuse element is read out.

22. The fuse circuit according to claim 21, wherein the power supply voltage of said determination circuit is set at substantially the same voltage as voltage applied to said state holding section via the electrical fuse element when the electrical fuse element is set in the destructive state and is potential difference lower at least the threshold voltage of an NMOS transistor.

23. The fuse circuit according to claim 20, wherein said determination circuit includes a state holding section which detects a current flowing when the electrical fuse element is set in the destructive state and holds a state which is inverted from an initial state and an initial state setting section which determines an initial state of said state holding section in synchronism with a read start signal and determines the destructive/nondestructive state of the electrical fuse element.

24. The fuse circuit according to claim 23, wherein the power supply voltage of said determination circuit is set at substantially the same voltage as voltage applied to said state holding section via the electrical fuse element when the electrical fuse element is set in the destructive state and is potential difference lower at least the threshold voltage of an NMOS transistor.

25. The fuse circuit according to claim 20, wherein said second current supply circuit supplies a current through a current path of an NMOS transistor, sets a gate potential of the NMOS transistor to voltage higher than the sum of the power supply voltage an the threshold voltage of the NMOS transistor at least at the time of readout of the destructive/nondestructive state of the electrical fuse element and at the time of determination of the destructive state of the electrical fuse element and sets the gate potential of the NMOS transistor to one of the power supply voltage and ground potential at least at the time of destruction of the electrical fuse element.

26. The fuse circuit according to claim 20, wherein said second current supply circuit includes a constant voltage generator which generates constant voltage and supplies a constant current to the electrical fuse element by applying the constant voltage to the electrical fuse element.

27. The fuse circuit according to claim 26, wherein said second current supply circuit supplies a current through a current path of an NMOS transistor, a gate potential of the NMOS transistor being set at substantially the same potential as the power supply voltage.

28. The fuse circuit according to claim 23, wherein the read start signal is generated in synchronism with a signal which is output when the power supply voltage and internal power supply potentials are set to preset potentials and the normal operation can be started.

29. The fuse circuit according to claim 23, wherein the read start signal is generated in synchronism with a signal which sets an internal signal output before starting the normal operation to an initial state each time a series of normal operations is performed after turn-ON of the power supply voltage and the readout operation by said readout section is performed before the normal operation is started for each series of normal operations.

30. A fuse circuit which selectively destroys electrical fuse elements and selectively reads out destructive/nondestructive states of the electrical fuse elements, comprising:
a fuse element destroying section which destroys the electrical fuse element;
a readout section which reads out the destructive/nondestructive state of the electrical fuse element; and
a destruction determining section which determines the destructive state of the electrical fuse element;
wherein the direction of a current flowing in said fuse element destroying section to destroy the electrical fuse element, the direction of a current flowing in said readout section to read out the destructive/nondestructive state of the electrical fuse element and the direction of a current flowing in said destruction determining section to determine the destructive state of the electrical fuse element are set in the same direction,
wherein said fuse element destroying section includes a constant potential applying circuit which applies constant potential to a terminal of the electrical use element which is opposite to a stress applying circuit and a second separation/connection section which electrically and selectively separates and connects the electrical fuse element and said constant potential applying circuit from and to each other, and the operation for destroying the electrical fuse element is performed after the terminal of the electrical fuse element which is opposite to said stress applying circuit is charged to constant potential before destruction of the electrical fuse element.

31. The fuse circuit ding to claim 30, wherein said fuse element destroying section includes said stress applying circuit which applies stress of one of high voltage and large current to the electrical fuse element and a potential fixing circuit which sets the electrical fuse element at fixed potential and said stress applying circuit and potential fixing circuit are activated at least when the electrical fuse element is destroyed.

32. The fuse circuit according to claim 31, wherein said stress applying circuit includes a stress generator which generates one of high voltage and large current and a state setting section which selectively applies one of ground potential, high voltage and large current generated from said stress generator to the electrical fuse element or sets the electrical fuse element into an electrically floating state, one of the high voltage and large current generated from said stress generator is applied the electrical fuse element by use of said state setting section at the time of destruction of the electrical fuse element, the electrical fuse element is set into the electrically floating state at the time of readout of the destructive/nondestructive state of the electrical fuse element and at the time of determination of the destructive state of the electrical fuse element, and the electrical fuse element is set at the ground potential when the normal operation is performed.

33. The fuse circuit according to claim 32, wherein said stress generator includes a potential generator which generates constant potential and generates one of potential which is set at substantially the same potential as that generated by said current supply circuit and potential having potential difference lower than the threshold voltage of a PN junction in a forward bias direction at least at the time of readout of the destructive/nondestructive state of said electrical fuse element and at the time of determination of the destructive state of the electrical fuse element.

34. A fuse circuit which selectively destroys electrical fuse elements and selectively reads out destructive/nondestructive states of the electrical fuse elements, comprising:
a program voltage generating section which is configured to selectively apply program voltage for destroying the electrical fuse element to one-side ends of the electrical fuse elements to selectively destroy the electrical fuse elements;
a read voltage generating section which is configured to selectively apply read voltage for reading out the destructive/nondestructive states of the electrical fuse elements; and
a readout section which is connected to the other ends of the electrical fuse elements and configured to read out the destructive/nondestructive states of the electrical fuse elements when the read voltage is applied to the one-side ends of the electrical fuse elements from said read voltage generating section,
wherein voltage is applied to a portion of the electrical fuse element which has higher withstand voltage at the time of destruction of the electrical fuse element by use of said program voltage generating section and at the time of readout of the destructive/nondestructive state of the electrical fuse element by use of said readout section.

35. A fuse circuit which selectively destroys electrical fuse elements and selectively reads out destructive/nondestructive states of the electrical fuse elements, comprising:
a program voltage generating section which is configured to selectively apply program voltage for destroying the electrical fuse element to one-side ends of the electrical fuse elements to selectively destroy the electrical fuse elements;
a read voltage generating section which is configured to selectively apply read voltage for reading out the destructive/nondestructive states of the electrical fuse elements; and
a readout section which is connected to the other ends of the electrical fuse elements and configured to read out the destructive/nondestructive states of the electrical fuse elements when the read voltage is applied to the one-side ends of the electrical fuse elements from said read voltage generating section,
wherein the electrical fuse elements are capacitors, one electrode of each of the capacitors being formed of a well region in a semiconductor substrate, the well region is commonly used by a plurality of capacitors, program voltage is applied to the well region from said program voltage generating section when the capacitor is dielectrically broken down and programmed, and read voltage is applied to the well region from said readout section at least when the destructive/nondestructive state of the capacitor is read out.

36. A fuse circuit which selectively destroys electrical fuse elements and selectively reads out destructive/nondestructive states of the electrical fuse elements, comprising:
a program voltage generating section which is configured to selectively apply program voltage for destroying the electrical fuse element to one-side ends of the electrical fuse elements to selectively destroy the electrical fuse elements;
a read voltage generating section which is configured to selectively apply read voltage for reading out the destructive/nondestructive states of the electrical fuse elements; and a readout section which is connected to the other ends of the electrical fuse elements and configured to read out the destructive/nondestructive states of the electrical fuse elements when the read voltage is applied to the one-side ends of the electrical fuse elements from said read voltage generating section, wherein the electrical fuse elements are trench capacitors each of which includes a first electrode formed of a well region in a semiconductor substrate, a capacitor insulating film formed on an inner wall of a trench formed in the semiconductor substrate to penetrate through the well region and a second electrode formed of a conductive film buried in the trench, the well region is commonly used by a plurality of trench capacitors, program voltage is applied to the first electrode from said program voltage generating section when the trench capacitor is dielectrically broken down and programmed, and read voltage is applied to the first electrode from said readout section when the destructive/nondestructive state of the trench capacitor is read out.

37. A fuse circuit which selectively destroys electrical fuse elements and selectively reads out destructive/ nondestructive states of the electrical fuse elements, comprising:

a program voltage generating section which is configured to selectively apply program voltage for destroying the electrical fuse element to one-side ends of the electrical fuse elements to selectively destroy the electrical fuse elements;

a read voltage generating section which is configured to selectively apply read voltage for reading out the destructive/nondestructive states of the electrical fuse elements; and a readout section which is connected to the other ends of the electrical fuse elements and configured to read out the destructive/nondestructive states of the electrical fuse elements when the read voltage is applied to the one-side ends of the electrical fuse elements from said read voltage generating section, wherein said readout section includes a second current supply circuit which causes a current to flow through the electrical fuse element and a determination circuit which detects the magnitude of a current flowing through the electrical fuse element and determines the destructive/nondestructive state of the electrical fuse element, and said second current supply circuit and determination circuit are activated at least when the destructive/nondestructive state of the electrical fuse element is read out.

38. The fuse circuit acording to claim 37, wherein said second current supply circuit supplies a current through a current path of an NMOS transistor, sets a gate potential of the NMOS transistor to voltage higher than the sum of the power supply voltage and the threshold voltage of the NMOS transistor at least at the time of readout of the destructive/nondestructive state of the electrical fuse element and at the time of determination of the destructive state of the electrical fuse element and sets the gate potential of the NMOS transistor to one of the power supply voltage and ground potential at least at the time of destruction of the electrical fuse element.

39. The fuse circuit according to claim 37, wherein said second current supply circuit includes a constant voltage generator which generates constant voltage and supplies a constant current to the electrical fuse element by applying the constant voltage to the electrical fuse element.

40. The fuse circuit according to claim 39, wherein said second current supply circuit supplies a current through a current path of an NMOS transistor, a gate potential of the NMOS transistor being set at substantially the same potential as the power supply voltage.

41. The fuse circuit according to claim 37, wherein said determination circuit includes a state holding section which detects a current flowing when the electrical fuse element is set in the destructive state and holds a state which is inverted from an initial state and an initial state setting section which determines an initial state of said state holding section in synchronism with a read start signal and determines the destructive/nondestructive state of the electrical fuse element.

42. The fuse circuit according to claim 41, wherein the power supply voltage of said determination circuit is set at substantially the same voltage as voltage applied to said state holding section via the electrical fuse element when the electrical fuse element is set in the destructive state and is potential difference lower at least the threshold voltage of an NMOS transistor.

43. The fuse circuit according to claim 37, wherein said determination circuit includes a state holding section which detects a current flowing when the electrical fuse element is set in the destructive state and holds a state which is inverted from an initial state and a first separation/connection section which electrically separates or connects the electrical fuse element, and said state holding section and the electrical fuse element are electrically connected to each other by means of said first separation/connection section at least when the destructive/nondestructive state of the electrical fuse element is read out.

44. The fuse circuit according to claim 43, wherein the power supply voltage of said determination circuit is set at substantially the same voltage as voltage applied to said state holding section via the electrical fuse element when the electrical fuse element is set in the destructive state and is potential difference lower at least the threshold voltage of an NMOS transistor.

45. The fuse circuit according to claim 41, wherein the read start signal is generated in synchronism with a signal which is output when the power supply voltage and internal power supply potentials are set to preset potentials and the normal operation can be started.

46. The fuse circuit according to claim 41, wherein the read start signal is generated in synchronism with a signal which sets an internal signal output before starting the normal operation to an initial state for each series of normal operations after turn-ON of the power supply voltage and the readout operation by said readout section is performed before the normal operation is started for each series of normal operations.

47. A fuse circuit which selectively destroys electrical fuse elements and selectively reads out destructive/ nondestructive states of the electrical fuse elements, comprising:

a program voltage generating section which is configured to selectively apply program voltage for destroying the electrical fuse element to one-side ends of the electrical fuse elements to selectively destroy the electrical fuse elements;

a read voltage generating section which is configured to selectively apply read voltage for reading out the destructive/nondestructive states of the electrical fuse elements; and a readout section which is connected to the other ends of the electrical fuse elements and configured to read out the destructive/nondestructive states of the electrical fuse elements when the read voltage is applied to the one-side ends of the electrical fuse elements from said read voltage generating section, wherein said program generating section includes a constant potential applying circuit which applies constant potential to a terminal of the electrical fuse element which lies in opposition to a stress applying circuit and a second separation/connection section which electrically and selectively separates and connects the electrical fuse element and said constant potential applying circuit from and to each other, and the operation for destroying the electrical fuse element is performed after the terminal of the electrical fuse element which lies in opposition to said stress applying circuit is charged to constant potential before destruction of the electrical fuse element.

48. The fuse circuit according to claim 47, wherein said program voltage generating section includes said stress applying circuit which applies stress of one of high voltage and large current to the electrical fuse element and a potential fixing circuit which sets the electrical fuse element at fixed potential and said stress applying circuit and potential fixing circuit are activated at least when the electrical fuse element is destroyed.

49. The fuse circuit according to claim 48, wherein said stress applying circuit includes a stress generator which generates one of high voltage and large current and a state setting section which selectively applies one of ground potential, high voltage and large current generated from said stress generator to the electrical fuse element or sets the electrical fuse element into an electrically floating state, one of the high voltage and large current generated from said stress generator is applied the electrical fuse element by use of said state setting section at the time of destruction of the electrical fuse element, the electrical fuse element is set into the electrically floating state at the time of readout of the destructive/nondestructive state of the electrical fuse element and at the time of determination of the destructive state of the electrical fuse element, and the electrical fuse element is set at the ground potential when the normal operation is performed.

50. The fuse circuit according to claim 49, wherein said stress generator includes a potential generator which generates constant potential and generates one of potential which is set at substantially the same potential as that generated by said current supply circuit and potential having potential difference lower than the threshold voltage of a PN junction in a forward bias direction at least at the time of readout of the destructive/nondestructive state of the electrical fuse element and at the time of determination of the destructive state of the electrical fuse element.

* * * * *